(12) United States Patent
Yamamoto

(10) Patent No.: US 7,431,807 B2
(45) Date of Patent: Oct. 7, 2008

(54) EVAPORATION METHOD USING INFRARED GUIDING HEATER

(75) Inventor: Hitoshi Yamamoto, Pennington, NJ (US)

(73) Assignee: Universal Display Corporation, Ewing, NJ (US)

( * ) Notice: Subject to any disclaimer, the term of this patent is extended or adjusted under 35 U.S.C. 154(b) by 549 days.

(21) Appl. No.: 11/030,076

(22) Filed: Jan. 7, 2005

(65) Prior Publication Data

US 2006/0153986 A1 Jul. 13, 2006

(51) Int. Cl.
*C23C 14/12* (2006.01)
*C23C 16/448* (2006.01)

(52) U.S. Cl. .............................. 204/192.1; 204/193.12; 427/255.6; 427/8

(58) Field of Classification Search .............. 204/192.1, 204/192.13; 427/255.6, 8
See application file for complete search history.

(56) References Cited

U.S. PATENT DOCUMENTS

| | | | |
|---|---|---|---|
| 3,927,638 A | 12/1975 | Sakaue et al. | |
| 4,579,083 A | 4/1986 | Boivin | |
| 5,082,545 A * | 1/1992 | Tanaka et al. | 204/298.03 |
| 5,085,166 A | 2/1992 | Oka et al. | |
| 5,094,880 A | 3/1992 | Hongoh | |
| 5,225,036 A * | 7/1993 | Watanabe et al. | 438/597 |
| 5,233,261 A | 8/1993 | Wajid | |
| 5,242,479 A | 9/1993 | Movchan et al. | |
| 5,801,826 A | 9/1998 | Williams | |
| 5,957,581 A | 9/1999 | Katzir et al. | |
| 6,337,102 B1 | 1/2002 | Forrest et al. | |
| 6,530,916 B1 | 3/2003 | Shimmick | |
| 6,559,065 B2 * | 5/2003 | Kawashima | 438/758 |
| 6,698,958 B2 * | 3/2004 | Emery et al. | 400/613 |
| 6,726,812 B1 * | 4/2004 | Toyama | 204/192.11 |
| 6,776,847 B2 * | 8/2004 | Yamazaki et al. | 118/724 |
| 6,794,649 B2 | 9/2004 | Thrash et al. | |
| 6,797,337 B2 | 9/2004 | Dando et al. | |
| 6,816,316 B2 | 11/2004 | Caudle et al. | |
| 2002/0011852 A1 | 1/2002 | Mandelis et al. | |
| 2002/0071963 A1 | 6/2002 | Forrest et al. | |
| 2004/0083963 A1 | 5/2004 | Dando et al. | |

(Continued)

FOREIGN PATENT DOCUMENTS

EP 0 997 552 5/2000

(Continued)

OTHER PUBLICATIONS

S. Hata, et al., "Fabrication of Thin Film Metallic Glass and its Application to Microactuator", Proceedings of the SPIE, vol. 3892: Device and Process Technologies for MEMS and Microelectronics, , pp. 97-108, Oct. 1999.

(Continued)

*Primary Examiner*—Bret Chen
(74) *Attorney, Agent, or Firm*—Kenyon & Kenyon LLP

(57) ABSTRACT

A method for evaporating a solid organic material by sublimation using an infrared guiding heater which minimizes temperature gradients in the bulk of the organic target. The bulk is heated to a temperature below the sublimation temperature of the target. A localized area of the target is sublimated by the infrared guiding heater while regulating the temperature of the bulk. The vapor is then deposited over, and condensed on, a substrate to form a solid organic layer.

11 Claims, 8 Drawing Sheets

U.S. PATENT DOCUMENTS

2004/0083969 A1 * 5/2004 Kijima et al. ............... 118/719

FOREIGN PATENT DOCUMENTS

| EP | 1336501 A2 * | 8/2003 |
| --- | --- | --- |
| GB | 1 473 535 | 5/1977 |
| JP | 61 069960 | 4/1986 |
| JP | 63190160 | 8/1988 |
| JP | 10 025563 | 1/1998 |

OTHER PUBLICATIONS

P.Y. Wong, et al., "Optical effects of multilayer thin-film structures during zone-melting recrystallization with an infrared heat source", Journal of Applied Physics, vol. 70, No. 12, pp. 7594-7601, Dec. 15, 1991.

I.N. Miaoulis, et al., "Thermal analysis of zone-melting recrystallization of silicon-on-insulator structures with an infrared heat source: and overview", Journal of the Electrochemical society vol. 139, No. 9, pp. 2687-2696, Sep. 1992.

General Discussion from Particular Sciences for Material Characterisation In Ireland, <www.particular.ie/genevac_general_discussion.htm>, printed Sep. 23, 2004.

M. A. Baldo, et al., "Organic Vapor Phase Deposition", *Adv. Mater,10*, No. 18, pp. 1505-1514 (1998).

J.M. Liu, "Nonlinear generation of ultrashort infrared pulses", IEEE LEOS '94 Conference Proceedings, Boston, Massachusetts, vol. 2, pp. 90-91, Oct. 31-Nov. 3, 1994.

"Inorganic Chemistry" ($2^{nd}$ Edition) by Gary L. Miessler and Donald A. Tarr, Prentice Hall, pp. 1-3, 422-424, 442, Aug. 1999 version.

< http://www.kagaku.com/thermo/tech.html> website.

< http://www.kagaku.com/thermo/emenu_top.html >, website, Major Products and product list.

* cited by examiner

EVAPORATION METHOD USING INFRARED GUIDING HEATER

TECHNICAL FIELD

The present invention relates to organic material deposition systems used to fabricate organic light emitting devices (OLEDs), and more specifically to systems for vapor deposition by sublimation.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Material impurities and defects in the organic layers increase non-radiative decay mechanisms and increase material reabsorption of photoemissions, resulting in an increase in heat generation, a lowering of the internal quantum efficiency, and a decrease in the life of the device.

A mechanism which produces defects during layer deposition is thermal decomposition. Thermal decomposition occurs when thermal energy causes bonds within organic molecules or chains to disassociate, breaking the organic material down into constituent components. The constituent components may also produce outgassing and secondary reactions. Thermal decomposition also alters the vaporization rate of the organic material used to form the organic layer.

Methods have been developed to reduce thermal decomposition and to improve the controllability of the vaporization rate. For example, U.S. Pat. No. 6,797,337 to Dando et al. ("Dando") discloses a method for reactively growing metallic layers by evaporating a metal organic precursor.

In Dando, a solid precursor comprising an organic metal-containing compound is vaporized by exposing a large area of the surface of the precursor to infrared radiation, sublimating the precursor at the surface without the necessity of heating the entire volume. A non-reactive carrier gas then transports the vaporized precursor to a reaction chamber containing a substrate. In the reaction chamber, the vaporized precursor undergoes a chemical reaction when mixed with separately injected chemical species, whereupon the desired metal is deposited on the substrate.

Many solid precursors decompose over time when held near their sublimation temperatures, especially if the decomposition temperature is below the sublimation temperature. By minimizing the heating of the bulk, Dando seeks to minimize bulk decomposition and thereby gain better control over the vaporization rate.

To sublimate a solid it is necessary to impart sufficient energy to transition the solid directly into vapor without melting. In the system of Dando, this can require a relatively large amount of energy to overcome the large temperature gradient between the bulk and the surface, which may result in decomposition of the organic material in the vapor. Vapor decomposition is of little consequence, since the precursor in Dando is purposely unstable, undergoing a chemical reaction prior to deposition and having some constituent components discarded in the reactor.

While the system of Dando does have some advantages for precursor-based deposition of films, it may not be well suited to precursor-free systems. Precursor-free systems vaporize a solid organic material, having the vapor condense on a substrate to assemble into a layer of solid organic material having the same molecular composition as the original target material. The absence of precursor components eliminates a source of contamination in the assembled organic layer. However, decomposition of either the bulk or the vapor diminishes the quality of the assembled organic layer and can compromise the operational efficiency of a finished device.

Another problem that may occur in the system of Dando is material instability produced by thermal cycling. While it is generally efficient to use a same target to create multiple layers, each time heating is suspended, residual energy from the surface dissipates into the bulk. These thermal oscillations can create molecular instability in solid organic materials sensitive to thermal history. Even when this instability does not create decomposition in the bulk, it can increase the likelihood of decomposition in the vapor.

An example of another method to reduce thermal decomposition and to improve the controllability of the vaporization rate is disclosed in U.S. Pat. No. 5,094,880 to Hongoh ("Hongoh"). Hongoh discloses a precursor-free system for the deposition of organic superconductor materials. Organic superconducting materials are particularly unstable, in comparison to inorganic semiconductors and insulators. Organic superconducting materials have relatively low sublimation temperatures and heat resistance and are prone to decomposing immediately upon vaporization by ordinary methods. Hongoh irradiates an actively cooled target with focused light energy to instantaneously heat a small surface portion of the target to sublimation. The energy density of the light is restrained to minimize decomposition of the material. Breakdowns in molecular structure are further reduced by applying pulsed light to shorten the heating time.

While the method of Hongoh offers several improvements over Dando, the temperature gradient at the surface of the cooled target in combination with the restraints on energy density results in a very slow deposition process. For the mass-manufacturing of organic components such as OLEDs, such a slow process is commercially impractical.

SUMMARY OF THE INVENTION

In certain embodiments of the invention, the bulk of a solid organic target is heated and a localized surface portion of the target is sublimated by selective heating. By heating the bulk, the temperature gradient between the bulk and the localized surface portion is minimized, facilitating rapid sublimation while minimizing the selectively applied energy needed to transition the solid organic material directly to vapor. Localized infrared heating need only provide enough additional energy to sublimate the stable evaporant, rather than to having to overcome a large temperature gradient in the localized surface region.

The wavelength of the localized heating may be selected to minimize penetration of the bulk by infrared energy sublimating the localized portion. This is accomplished by selecting a wavelength with a very high absorption coefficient in the target material.

The effects of thermal cycling are minimized by maintaining the bulk temperature over an extended period of hours or days. The bulk is heated to a "safe" temperature at which substantially no thermal decomposition occurs for an extended time. Since the decomposition-effect of heating is cumulative, the "safe" temperature is selected to offset the duration that bulk heating will be maintained.

By maintaining the organic material at a safe temperature, there is less contamination of the surface as compared with an organic material that is held at its sublimation temperature for an extended period of time. This means the surface may be kept clean and uncontaminated with decomposition products, so that sublimation may continuously take place from a fresh clean surface for a much longer period of time. In addition, the system can be kept at a high vacuum with much higher purity levels than when decomposition products are present on the surface.

Impurities introduced by precursor byproducts are eliminated by sublimating a solid target material which does not comprise a precursor. The target organic material that undergoes sublimation is deposited on the substrate without undergoing a chemical reaction, either by itself, or together with other materials such as dopants.

In other embodiments of the invention, the bulk of the solid organic target may not need to be heated, for example, whenever the size and temperature of the localized heating is controlled precisely enough to prevent decomposition. Such a method may be suitable for organic materials that do not so readily decompose at temperatures near the sublimation temperature.

The figures are not drawn to scale.

DETAILED DESCRIPTION

Specific representative embodiments of the invention will now be described, including how such embodiments may be made. It is understood that the specific methods, materials, conditions, process parameters, apparatus and the like do not necessarily limit the scope of the invention.

Figure 1:
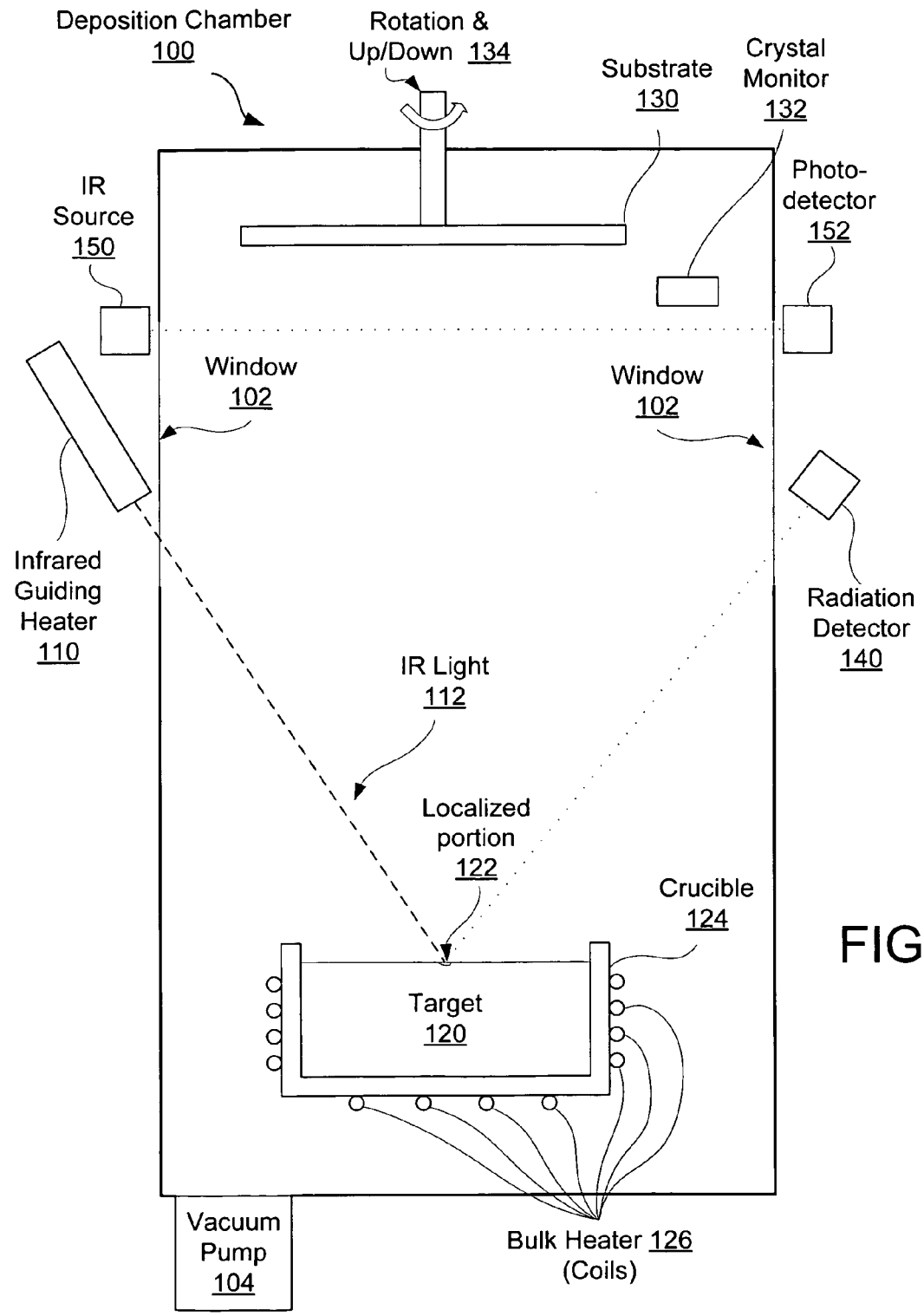
FIG. 1 illustrates a vacuum thermal evaporation (VTE) system as an embodiment of the present invention.

FIG. 1 illustrates a vacuum thermal evaporation (VTE) embodiment of the invention. A vacuum pump 104 creates a vacuum (for example, a high vacuum of $10^{-6}$ to $10^{-8}$ Torr) in a deposition chamber 100 containing the solid organic target material 120 and a substrate 130. A bulk heater 126 applies heat to the target 120, held in a crucible 124. An infrared guiding heater 110, irradiates 112 a localized portion 122 of the surface of the target 120 with infrared energy 112, sublimating the localized portion 122. The sublimated organic material is transported to the substrate 130 by thermal motion, where it condenses to form a layer.

Figure 2:
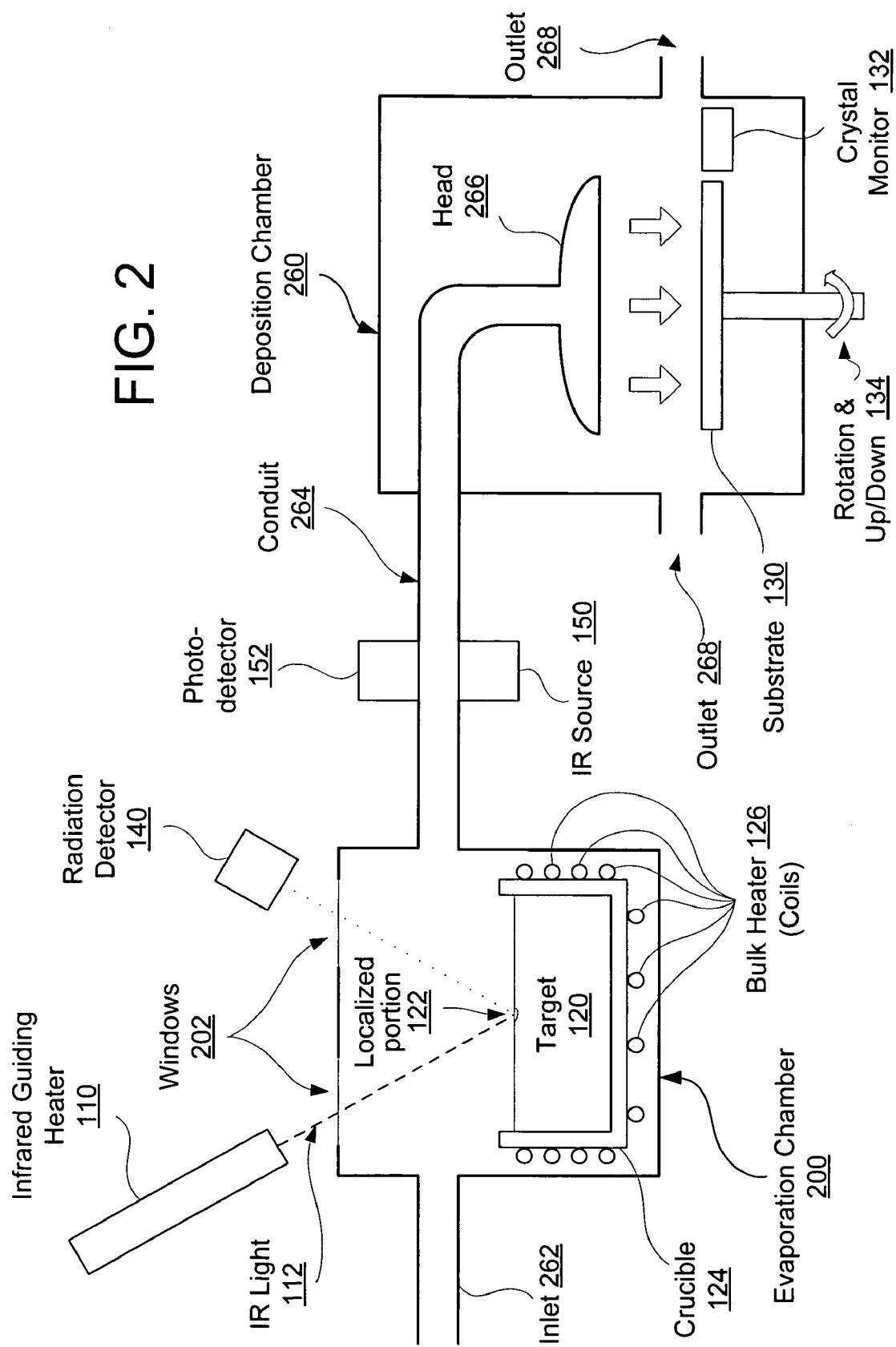
FIG. 2 illustrates an organic vapor phase deposition (OVPD) system as an embodiment of the present invention.

FIG. 2 illustrates an organic vapor phase deposition (OVPD) embodiment of the invention. Low-pressure organic vapor phase deposition (LP-OVPD) has been demonstrated as a superior alternative technique to vacuum thermal evaporation (VTE), in that OVPD improves control over dopant concentration of the deposited film, and is adaptable to rapid, particle-free, uniform deposition of organics on large-area substrates (see M. A. Baldo, M. Deutsch, P. E. Burrows, H. Gossenberger, M. Gerstenberg, V. S. Ban, and S. R. Forrest, Adv. Mater. 10, 1505 (1998)). Organic vapor phase deposition (OVPD) is inherently different from the widely used vacuum thermal evaporation (VTE), in that it uses a non-reactive carrier gas to transport organic vapors into a deposition chamber, where the molecules diffuse across a boundary layer and physisorb on the substrate. In LP-OVPD, the organic compound is thermally evaporated and then transported through a hot-walled gas carrier tube into a deposition chamber by an inert carrier gas toward a cooled substrate where condensation occurs. Flow patterns may be engineered to achieve a substrate-selective, uniform distribution of organic vapors, resulting in a very uniform coating thickness and minimized materials waste.

The target 120 is placed in an evaporation chamber 200 to be sublimated by infrared guiding heater 110. An inert, non-reactive gas (e.g., nitrogen, helium, argon, krypton, xenon, neon) flows into inlet 262 of the evaporation chamber 200, transporting the organic vapor to a deposition chamber 260 via a conduit 264. The organic vapor and carrier gas pass through a "shower" head 266, depositing the organic material on the substrate 130. The carrier gas then exits the deposition chamber 260 through an outlet 268. The pressure within the system may be, for example, between 0.001 and 100 Torr. Further discussion of OVPD can be found, for example, in U.S. Pat. No. 6,337,102 to Forrest et al., which is incorporated by reference.

Referring to both embodiments, the walls of deposition chamber 100, evaporation chamber 200, and conduit 264 may be heated to inhibit layer formation on the chamber walls and to promote transport of the vapor. The deposition chamber 260 in the OVPD system may also be heated. The deposition chamber 100/260 may include an adjustable mount 134 to hold substrate 130 that may be rotated during deposition to promote formation of an even layer. The mount 134 may also allow adjustment of the distance between the substrate 130 and the target 120, or the substrate 130 and the head 266. Chamber windows 102/202 are made of a material transparent to infrared such as quartz.

The target 120 may be crystalline, poly-crystalline, amorphous, or powdered, and may be in the form of a pellet.

Typical crucibles are one-to-three inches (2.5 to 7.6 centimeters) in diameter, although other sizes may be used.

The bulk of the target 120 is held at a temperature that minimizes gradients during surface heating while producing substantially no thermal decomposition over time. Since decomposition is a cumulative effect, the exact temperature for any given material depends upon how long the target will be held at a specified bulk temperature, the sublimation temperature of the material, and the thermal stability of the material. The target may be held at the specified temperature for at least twenty-four hours, or for some processes, at least six days. For organic materials having a sublimation temperature of about 200 and 400 degrees Celsius, an example of a bulk temperature is at least 100 degrees Celsius, but preferably at least 50 degrees Celsius less than the thermal decomposition temperature of the solid organic material at which decomposition spontaneously occurs. For materials with a sufficiently high decomposition temperature, the bulk temperature is preferably held within 10 to 50 degrees Celsius of the sublimation temperature.

The bulk heater 126 used to heat the target 120 may use any known method appropriate for organic materials. For example, bulk heater 126 may be an infrared heater, an electric coiled heating element (e.g., contact heater), a radio frequency (RF) heater, and an electromagnetic (EM) dielectric heater (heating either the bulk of the target 120 or the crucible 126). Examples of infrared heaters include carbon heaters, halogen lamp heaters, shortwave-infrared heaters, and xenon lamps. Examples of contact heaters include a coiled wire heated by a flow of electric current. Examples of RF heaters and EM dielectric heaters include coils.

Indirect heating may be used to heat the crucible 124 to heat the target 120. By using a crucible materials that absorbs infrared energy, RF, or EM and converts it to heat, energy applied to crucible 124 may be used to heat the target 120 by conduction. Likewise, if the crucible is thermally conductive, heat applied to the crucible 124 by a contact heater is conducted to the target.

Direct heating also may be used to heat the target 126. For example, infrared energy may be applied directly to the target 120, if the crucible 124 is transmissive to infrared energy (e.g., quartz or Pyrex). Since solid organic targets will absorb most of the infrared energy near the surface (i.e., low penetration), the infrared energy must be fairly low and rely upon thermal conduction to avoid decomposing the incident surface. Likewise, EM dielectric heating may be used to directly heat the target 120.

Preferably, for either direct or indirect heating, the energy applied by the bulk heater 126 should not produce a localized temperature in the target 120 more than 10 degrees greater than the temperature to be maintained in bulk. Heat or energy may be applied from multiple sides of the bulk, may be applied from the surface opposite the sublimation surface, and/or may be applied from the sublimation surface. Although bulk heater 126 is illustrated within chamber 100/200, it may also be an external device.

Carrier gas preheating in OVPD may contribute to the temperature of the bulk, but it is not considered suitable as a means for bulk heating because the temperature of the carrier gas is regulated primarily to control the vapor pressure of the target material in the carrier gas, rather than the temperature of the target 120 itself. As a result, carrier gas preheating may not have enough flexibility to maintain a particular temperature in the bulk with sufficient precision to achieve the desired results.

By minimizing the temperature gradient between the sublimated material and the bulk, organic material can be vaporized quickly with minimal energy. The present localized heating method is particularly suitable for organic materials that may decompose at temperatures at or near the sublimation temperature. The decomposition temperature is preferably sufficiently higher than the sublimation temperature such that the organic material may be vaporized at a high rate without causing significant decomposition. However, if there is only a relatively small difference between the sublimation temperature and the decomposition temperature, the spot size and the temperature of the spot may be precisely regulated, in combination, to produce the desired sublimation rate without causing significant decomposition. For example, if the decomposition temperature is only about 15 degrees Celsius higher than the sublimation temperature, the energy applied to the localized portion by the infrared heater 110 preferably raises the temperature of the organic material to not more than about 10 degrees Celsius higher than the sublimation temperature. In this case, if a high sublimation rate is desired, the spot size may be increased sufficient to produce the desired sublimation rate.

During deposition, feedback is used to regulate sublimation to avoid any significant quantity of decomposed material being deposited on the substrate. There may be a significant difference in the evaporation rate of organic molecules and their decomposed constituents. There may also be a difference in thermal and chemical properties between intact and decomposed materials. When decomposed material is detected, either directly or indirectly, a variety of mitigation responses may be applied, including: lowering the temperature of the bulk; adjusting a cross-sectional area of the infrared light 112 irradiating the localized portion 122; adjusting an intensity of the infrared light 112; adjusting the duration of infrared pulses if the infrared light 112 is pulsed; and changing a targeting of the infrared light 112 on the surface of the target 120 to avoid the area from which decomposed material originated.

A first type of feedback that may be employed is to monitor the deposition rate using an in-situ crystal monitor 132. A change in the deposition rate corresponds to a change in the evaporation rate, which may indicate a transition between intact and decomposed material. Examples of crystal monitors may be found, for example, in U.S. Pat. No. 4,579,083 to Boivin and U.S. Pat. No. 5,233,261 to Wajid, which are incorporated herein by reference.

A second type of feedback is absorption spectroscopy to monitor the presence of decomposition impurities in the organic vapor. The molecules in the vapor absorb optical energy, converting the absorbed energy into vibration. Different molecules and bonds have different vibrational states. A plurality of optical wavelengths are produced by optical emission source 150 to be detected by photo-detector 152. By calibrating the system to account for the vibrational energy already present due to sublimation, and measuring the percentage of energy across an optical spectrum which is transmitted through the vapor, a determination can be made as to which wavelengths are absorbed and which wavelengths are transmitted. As intact and decomposed materials have different absorption wavelengths, the presence or absence of decomposed material can be determined.

The optical emissions from source 150 may be infrared, although depending upon materials, other wavelengths might be used. To minimize any contribution to decomposition that may be caused by the energy introduced by spectroscopy, the optical energy introduced by source 150 should be minimized. Additionally, the source 150/detector 152 combination may be placed adjacent to the path between target 120 and the substrate 130 (VTE or OVPD), or at a chamber outlet 268 (OVPD), to decrease the likelihood that the vapor sampled will be included in the deposited layer. Additionally, to increase resolution, the optical energy may be reflected through the vapor one-or-more times before reaching detector 152. A representative spectroscopy system is demonstrated in U.S. Pat. No. 5,801,826 to Williams, which is incorporated herein by reference. A method relevant to calibration of the absorption spectra of an organic material subject to decomposition is disclosed in U.S. Pat. No. 6,794,649 to Thrash et al., which is incorporated herein by reference. Other types of spectrometers may be used, including miniature integrated mass spectrometers, either in-situ or at an outlet 268.

A third type of radiometry feedback uses radiation detector 140 to determine the temperature at the localized portion and to detect decomposed material at the surface of the target. This feedback technique is well suited to embodiments employing a pulsed infrared guiding heater. After the surface of the target is heated by an infrared guiding heater 110 (or 810 in FIG. 8), the diffusion of remnant energy into the bulk produces an infrared signal which decays over time. The rate of decay is different for intact and decomposed material, such that areas of decomposition can be identified by measurement for changes in the time dependence of the thermal signal. The temperature at the area of heating can also be determined by this method; see, for example, U.S. Pat. No. 5,957,581 to Katzir et al., which is incorporated herein by reference.

Another radiometry technique to measure thermal properties of the target 120 includes an acousto-optic modulator in the infrared guiding heater to vary the phase of pulsed laser light and measures changes in the amplitude and phase of IR emissions from the target; see U.S. Published Application 2002/0011852 A1 to Mandelis et al., which is incorporated herein by reference. A variation on this technique can be performed with continuous-wave laser light by including an acousto-optic modulator in the infrared guiding heater to modulate the IR light, and by including a filter on radiation detector 140 to block the wavelength of reflected the IR light, while passing the wavelengths of other emissions from the target.

A fourth type of feedback that can be used to select areas for targeting with the infrared guiding heater is passive thermographic imaging of the surface of the target 120. Relative differences in the quantity of the radiation emissions from the surface of the bulk can be used to identify uneven heating due to, for example, geometric changes to the surface profile of the target 120 or patches of decomposed material.

Figure 3:
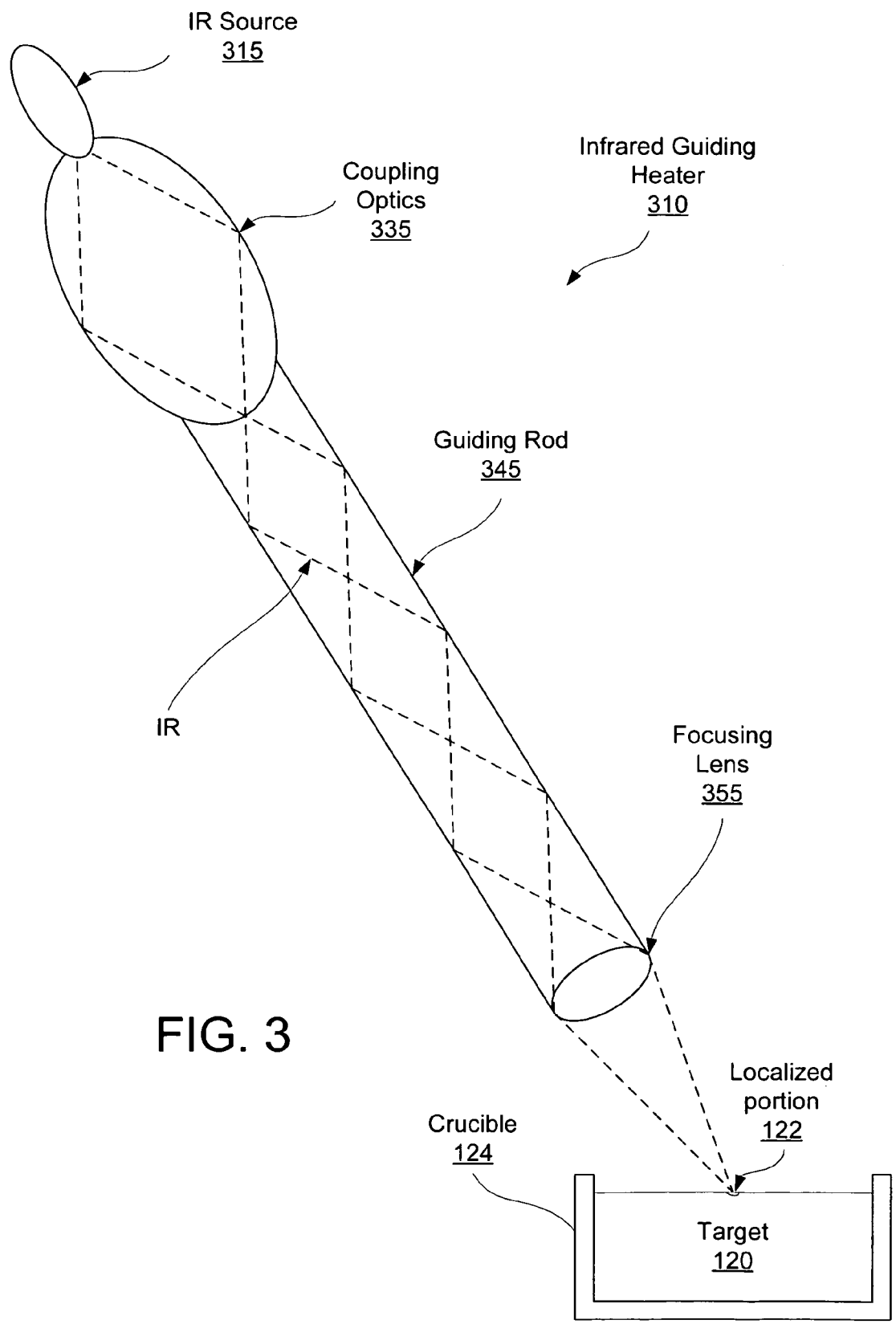
FIG. 3 is a component diagram of an example infrared guiding heater.

FIG. 3 is a component diagram of a representative infrared guiding heater 310 as an embodiment of heater 110. Light from an infrared source 315 is coupled by coupling optics 335 into an optical waveguide. The coupling optics may include, among other things, one or more lenses and a gold or other IR-reflective mirror to shape and collect the infrared energy.

The optical waveguide may be a quartz guiding rod 345, guiding light by total internal reflection. The optical waveguide might also be a collimator formed, for example, from a bundle of quartz tubes, or a bundle of graded-index or step-index optical fibers made from a material with low infrared absorption. Examples of infrared source 315 include incoherent sources such as a carbon heater, a halogen lamp heater, a shortwave infrared heater, and a xenon lamp. The infrared source may also be a coherent source such as a continuous wave or a pulsed laser.

Light from the waveguide is then focused using focusing lens 355 as an embodiment of heater 110. Additional optic elements may be included to adjust the focus so that the diameter of the infrared light incident on the target can be adjusted to control a cross-sectional area of the energy at the surface of the target.

Figure 4:
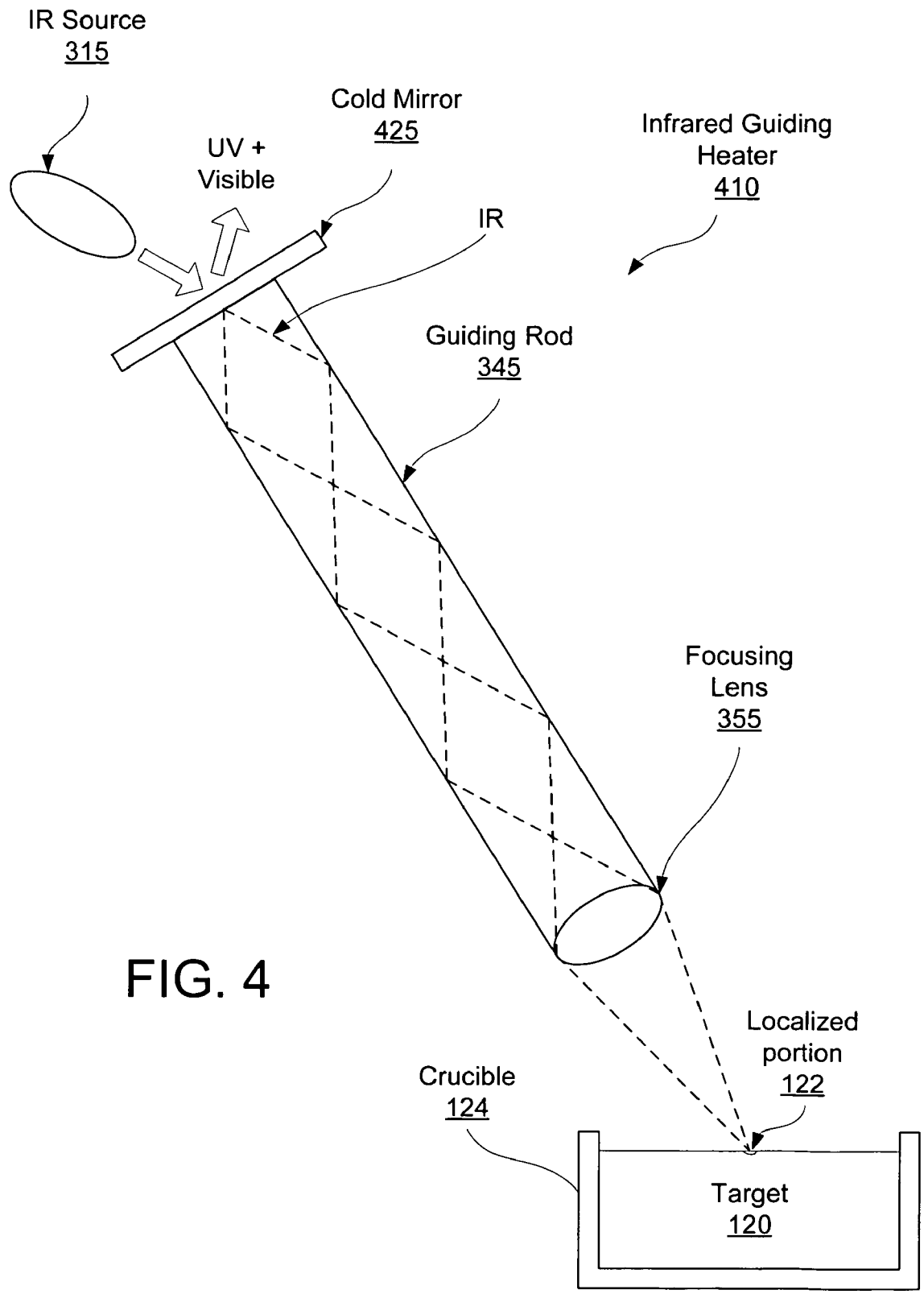
FIG. 4 is a component diagram of another example of an infrared guiding heater.

FIG. 4 is a component diagram of an example infrared guiding heater 410 as another embodiment of heater 110. An optical filter, such as a cold mirror 425, is included to separate the infrared from other wavelengths. Narrower-band filters might also be used to select a particular range of infrared light. Although not illustrated, infrared guiding heater 410 may also include coupling optics.

Figure 5:
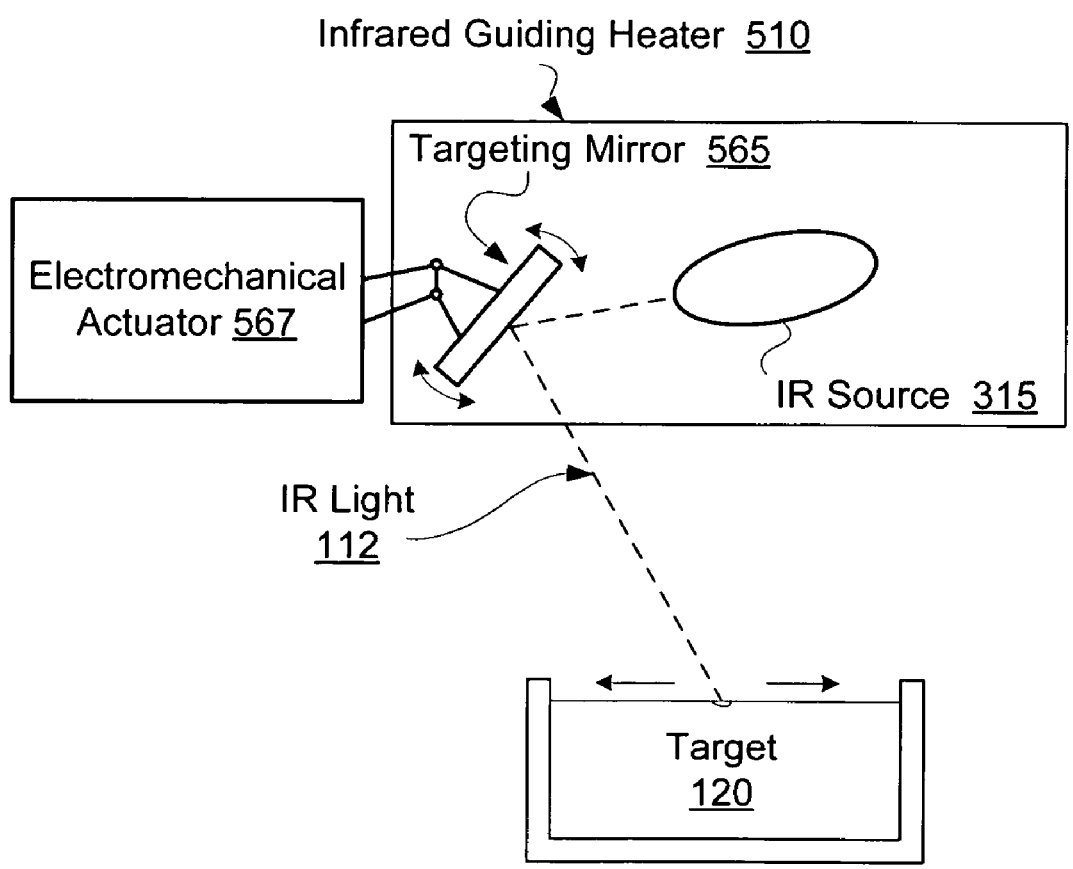
FIG. 5 illustrates the inclusion of a targeting mirror as a component of an infrared guiding heater.

FIG. 5 illustrates a targeting mirror 565 that may be included in an infrared guiding heater 510 as an embodiment of heater 110/310/410. At least one electromechanical actuator 567 directs where the infrared light 112 is incident on the surface of the target 120, enabling the system to scan the target. A prism or lens may also be used to target the system, or the entire guided heater may be repositioned by an actuator or actuators in order to target the infrared light. Although not shown in FIG. 5, guiding heater 510 may include the other optical components of guiding heaters 310 and 410. Additionally, a shutter may be included in the infrared heater 110/310/410/510 to pulse the infrared light 112.

The light 112 from the guiding heater 110/310/410/510 may be focused so that that the localized portion 122 is equivalent to less than 50% of the initial exposed area of the target 120 available for sublimation, prior to an initiation of sublimation. With this large incident exposure, the surface of the target may be scanned in a circular fashion. For tighter control, the light 112 from the guiding heater may be focused so that the localized portion 122 is equivalent to less than 10% of the initial exposed area of the target 120 available for sublimation, prior to an initiation of sublimation.

While pulses having a duration in the range of milliseconds may have advantages for overcoming a signal-to-noise ratio for radiometry, shorter pulses have the advantage of producing less conductive heating in the target 120. For examples, picosecond and femtosecond infrared pulses are generated over a broad infrared spectral range by J. M. Liu, "Nonlinear generation of ultrashort infrared pulses," IEEE LEOS '94 Conference Proceedings, Vol. 2, pp. 90-91 (1994). However, since little heat is produced by such short pulses, radiometric temperature measurement may be rendered ineffective. Therefore, while very short pulses can be advantageous for avoiding decomposition in the bulk, it is important that the pulse energy is sufficiently low so that only inter-molecular (not intra-molecular) bonds are broken during sublimation.

Figure 6:
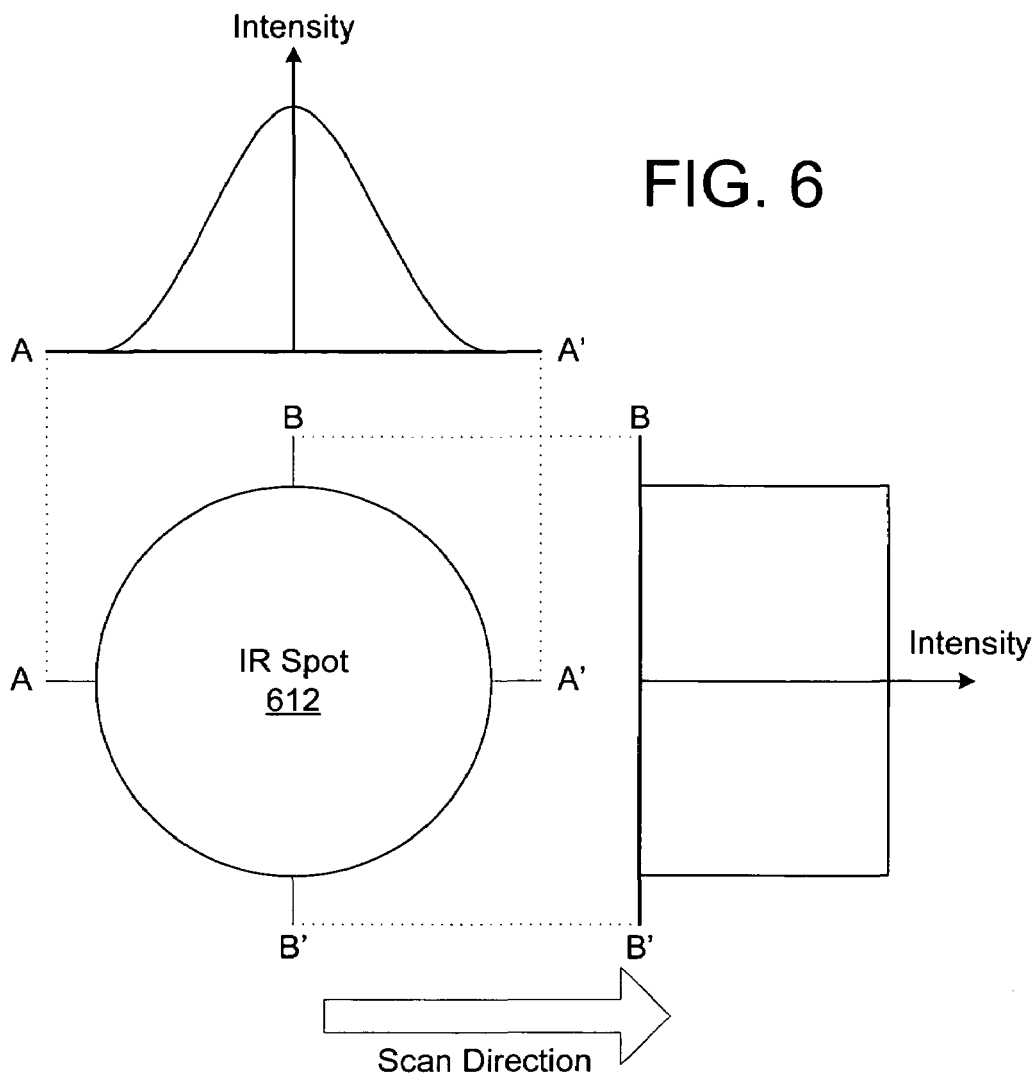
FIG. 6 illustrates an intensity profile of an infrared spot which may be employed with embodiments of the present invention.
Figure 7:
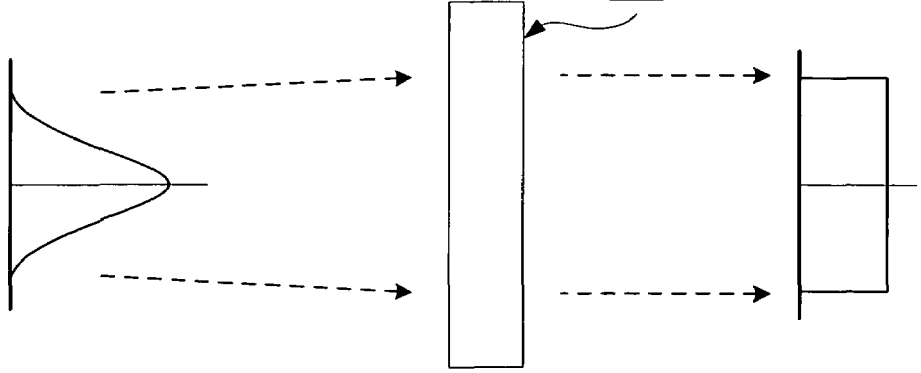
FIG. 7 illustrates an optical component for inclusion in an infrared guiding heater to obtain the intensity profile illustrated in FIG. 6.

Additionally, the intensity profile of the infrared spot 612 on the surface of the target 120 may be shaped to minimize surface heating. For example, as shown in FIG. 6, if the spot is to be scanned across the surface of the target 120 with either overlapping pulses or a continuous beam, the intensity profile transverse to the scan direction should be squared-off (a.k.a. "top-hat" profile) instead of Gaussian. This lessens the heating of lateral material that is not sublimated because the incident energy at the tails of the Gaussian is below the energy required for sublimation. As shown in FIG. 7, one way this can be accomplished is by including diffractive optics in the infrared heater 110/310/410/510. Diffractive optical elements can be tailored to remap a wavefront to a desired intensity and phase profile at a specified plane. Examples are illustrated in U.S. Pat. No. 6,530,916 to Shimmick and U.S. Pat. No. 6,816,316 to Caudle et al. The IR spot 612 may also be shaped to have a top-hat profile on both axes. Using a collimator formed from a bundle of quartz tubes or a bundle of optical fibers, as discussed above, may also shape the intensity profile of the incident spot, if light overlaps from the respective tubes/fibers at incident surface.

Figure 8:
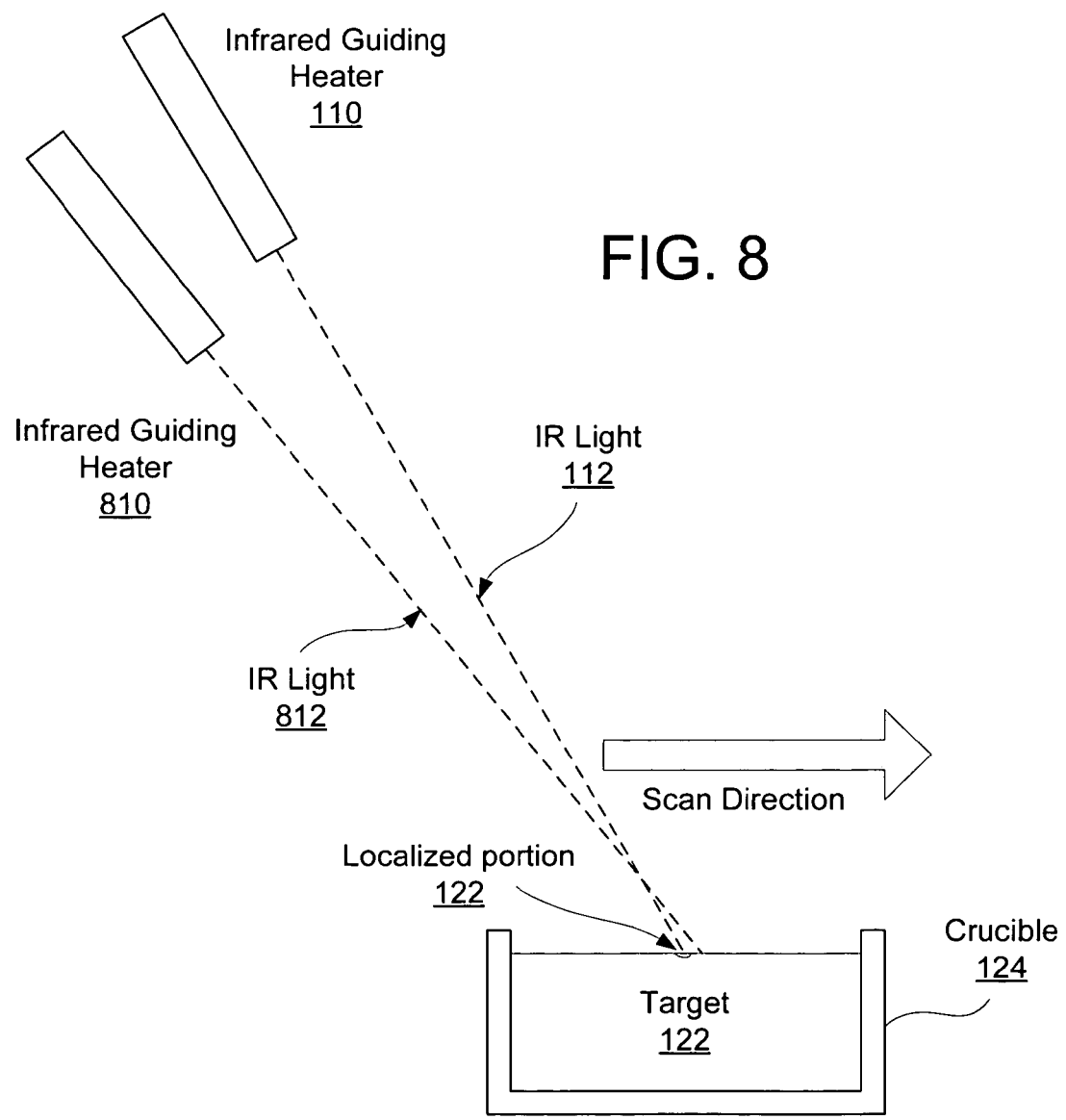
FIG. 8 illustrates an embodiment that includes two infrared guiding heaters.

FIG. 8 illustrates an embodiment having two infrared guiding heaters 110 and 810. The second guiding heater 810 may be used to preheat an area before sublimation, raising the surface temperature to a temperature between the bulk temperature and the sublimation temperature (e.g., to just below sublimation) so that the temperature induced at sublimation can be more tightly controlled. The second guiding heater 810 may also be used to take a radiometric measurement in advance of the site being sublimated. The first and second guiding heaters may be of a same configuration, or different, depending upon the function. For example: the second guiding heater 810 may be continuous-wave and provide preheating, while the first guiding heater 110 applies pulsed-light to exceed the sublimation threshold; the second guiding heater may have a larger spot-size than the first guiding heater; the first guiding heater 110 may emit a wavelength optimized for absorption, while the second guiding heater may be optimized for radiometric detection of decomposed material.

Figure 9:
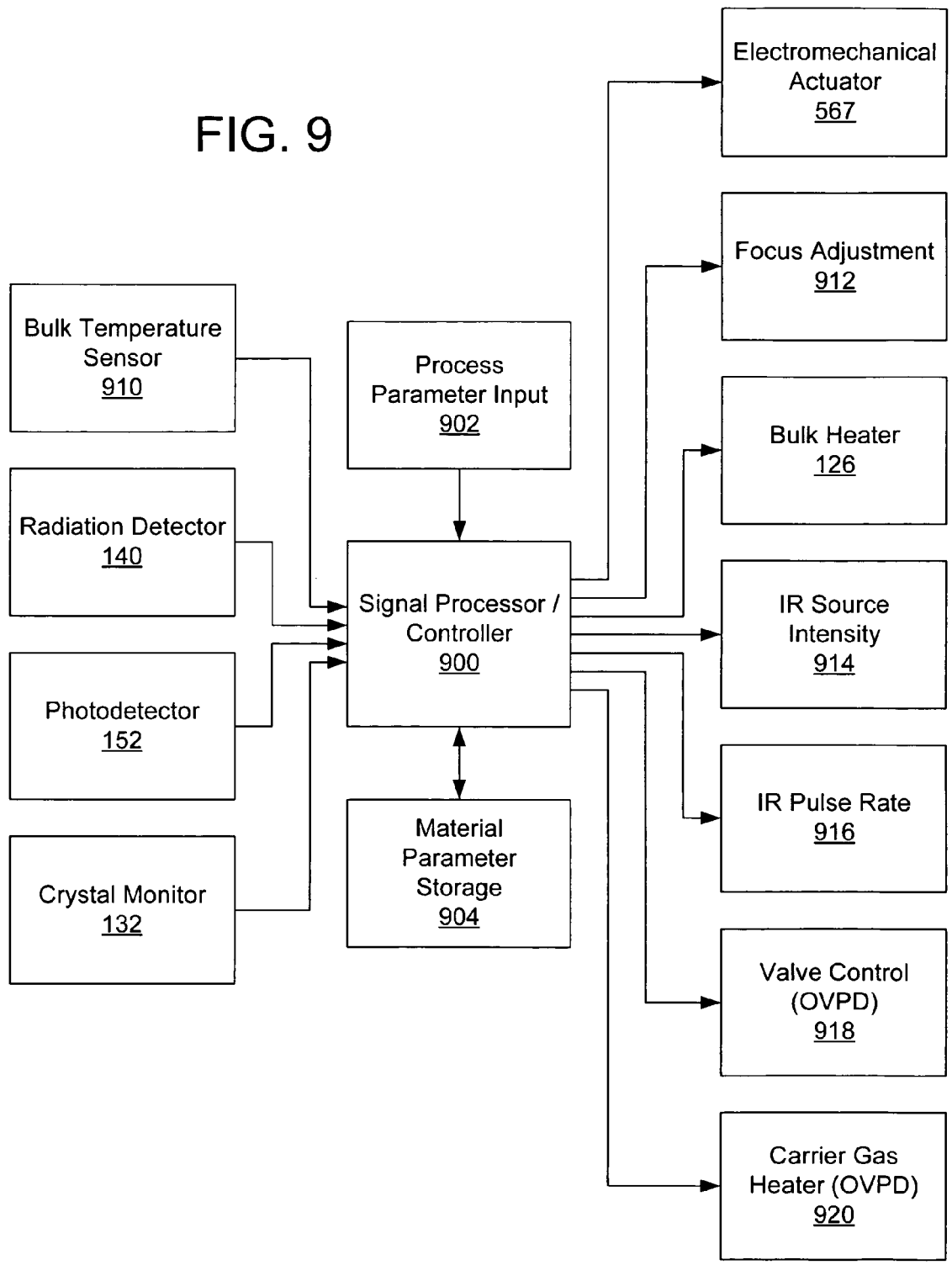
FIG. 9 is a block diagram of a control system for the embodiments of the present invention.

FIG. 9 is a block diagram of a control system for the embodiments of the present invention. A signal processor/controller 900 receives process parameter input 902 as specified by a user via a terminal. Material parameters such as sublimation temperature information, absorption spectra, and absorption rates may be stored in the system in material parameter storage 904. The signal processor/controller 900 executes instructions which control output responses to input data and controls targeting of the IR energy 112. The signal processor 900 receives input data from a bulk temperature sensor 910, the radiation detector 140, the photodetector 152, and the crystal monitor 132. Bulk temperature sensor may be, for example a thermocouple or p-n junction device attached to crucible 124 or a passive radiometric temperature measurement system.

In response to the input data, the signal processor/controller 900 may adjust one or more of the electromechanical actuator 567 selecting the location of the localized portion 122 on the surface of the target 120; a focus adjustment 912 controlling the size of the incident spot 612 and the size of the localized portion 122; the temperature produced by the bulk heater 126; an intensity control 914 of the IR source 315; a pulse rate control 916 of either the IR source 315 or a shutter; a valve control 918 controlling the flow of carrier gas in the OPVD embodiment; and/or a temperature control 920 of a carrier gas preheater in the OVPD embodiment. The Z-axis position of the substrate may also be adjusted.

In addition to conventional VTE and OPVD, the concepts of the invention may be applied to other organic vapor delivery techniques. For example, the concepts of the invention can be used with organic molecular beam vapor deposition (OMVD), which is a flavor of molecular beam epitaxy (MBE). As an OMVD embodiment of the invention, an effusion cell (evaporant source) comprises the target 120, crucible 124, bulk heater 126, and infrared guiding heater 110. The OMVD embodiment may also employ the various feedback elements of the invention (e.g, radiation detector 140, IR source 150, photodetector 152, and crystal monitor 132).

Examples of organic target materials that might be evaporated in the embodiments of present invention include organic and organometallic materials. The organic materials may or may not contain metal atoms. The organic material may be a small molecule material, although other materials, such as monomers, oligomers, or dendrimers, may also be used.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

Examples of organic materials that might be evaporated include: CBP (4,4'-N,N-dicarbazole-biphenyl); m-MTDATA (4,4',4''-tris(3-methylphenylphenlyamino)triphenylamine); $Alq_3$ (8-tris-hydroxyquinoline aluminum); Bphen (4,7-diphenyl-1,10-phenanthroline); n-BPhen (BPhen n-doped with lithium); $F_4$-TCNQ (tetrafluoro-tetracyano-quinodimethane); p-MTDATA (m-MTDATA p-doped with $F_4$-TCNQ); $Ir(ppy)_3$ (tris(2-phenylpyridine)-iridium); $Ir(ppz)_3$ (tris(1-phenylpyrazoloto,N,C(2')iridium(III)); BCP (2,9-dimethyl-4,7-diphenyl-1,10-phenanthroline); TAZ (3-phenyl-4-(1'-naphthyl)-5-phenyl-1,2,4-triazole); CuPc (copper phthalocyanine); NPD (N,N'-diphenyl-N—N'-di (1-naphthyl)-benzidine); TPD (N,N'-diphenyl-N—N'-di(3-toly)-benzidine); BAlq (aluminum(III)bis(2-methyl-8-hydroxyquinolinato)4-phenylphenolate); mCP (1,3-N,N-dicarbazole-benzene); DCM (4-(dicyanoethylene)-6-(4-dimethylaminostyryl-2-methyl)-4H-pyran); and DMQA (N,N'-dimethylquinacridone). These materials are merely examples, as the invention is not so limited.

Doping may be used to enhance conductivity in the deposited layer. An example of a p-doped hole transport layer is m-MTDATA doped with $F_4$-TCNQ at a molar ratio of 50:1, as disclosed in United States Patent Application Publication No. 2002-0071963 A1 to Forrest et al., which is incorporated by reference in its entirety. An example of an n-doped electron transport layer is BPhen doped with Li at a molar ratio of 1:1, which is also disclosed in United States Patent Application Publication No. 2002-0071963 A1 to Forrest et al.

The materials and methods described herein may have applications in devices other than OLEDs. For example, other optoelectronic devices such as organic solar cells and organic photodetectors may employ the materials and structures.

More generally, fabrication of organic devices, such as organic transistors, may employ the disclosed materials and methods.

Another embodiment of the invention includes the features of the other embodiments described above, but omits an element specifically directed to thermal management of the bulk of the target 120 (i.e. the bulk is neither actively heated nor cooled, omitting bulk heater 126). Active heating or cooling may be desirable because it gives more precise control over the temperature of the bulk. However, in some implementations, high precision temperature control may not be needed and it may be preferable to avoid expense and extra equipment associated with active heating or cooling.

Incidental heating of the bulk of the target 120 may still occur because of carrier gas preheating (OVPD) and thermal conduction of energy from the incident light 112/812. Even though there is no active heating or cooling, the thermal gradients at the localized portion may be minimized by actively regulating the incident energy. For example, utilizing feedback and adjusting a cross-sectional area of the targeted infrared energy, adjusting the intensity of the targeted infrared energy, adjusting the duration of an infrared pulse, and/or changing a targeting of the infrared energy to avoid a decomposed area of the surface of the target. Decomposition may also be reduced by minimizing energy conducted into the bulk by shaping the intensity profile of the incident spot to avoid lateral heating without sublimation. Further, if OVPD, the effects of thermal cycling may be mitigated by avoiding abrupt temperature fluctuations in the preheating of the carrier gas.

It is understood that various theories as to why the invention works are not intended to be limiting.

While the present invention is described with respect to particular examples and preferred embodiments, it is understood that the present invention is not limited to these examples and embodiments. The present invention as claimed therefore includes variations from the particular examples and embodiments described herein, as will be apparent to one of skill in the art.

What is claimed is:

1. A method, comprising:
   (a) providing a target consisting of a solid organic material;
   (b) heating a bulk of the solid organic material to a first temperature using a first heat source, the first temperature being below a sublimation temperature of the solid organic material;
   (c) sublimating a localized portion of the target by selectively heating the localized portion to a second temperature at or above the sublimation temperature using a second heat source;
   (d) transporting the sublimated organic material from the target to a substrate; and
   (e) depositing the sublimated organic material over the substrate to form a layer comprising the solid organic material;
   wherein the bulk is heated to the first temperature prior to sublimating the localized portion, and wherein the bulk is maintained at a temperature below the sublimation temperature of the solid organic material during sublimation.

2. The method of claim 1, wherein the first temperature is at least 50 degrees Celsius less than the thermal decomposition temperature of the solid organic material.

3. The method of claim 1, wherein the first temperature is 10 to 50 degrees Celsius less than the sublimation temperature.

4. The method of claim 1, wherein the second temperature is no more than 10 degrees Celsius above the sublimation temperature.

5. The method of claim 1, wherein sublimating the localized portion comprises:
   (c1) selectively targeting infrared energy onto the localized portion to selectively heat said localized portion to the second temperature.

6. The method of claim 5, further comprising:
   (f) scanning the infrared energy across a surface of the target.

7. The method of claim 5, wherein sublimating the localized portion further comprises:
   (c2) focusing the infrared energy to control a cross-sectional area of the infrared energy at a surface of the target.

8. The method of claim 1, wherein a surface area of the localized portion is equivalent to less than 10% of an initial exposed surface area of the target available for sublimation, prior to an initiation of sublimation.

9. The method of claim 1, further comprising:
   spectroscopically detecting impurities in the sublimated organic material indicative of decomposition; and
   responsive to detecting impurities in the sublimated organic material by performing at least one of:
   lowering said first temperature of the bulk;
   adjusting a cross-sectional area of targeted infrared energy applied to the localized portion to sublimate the solid organic material;
   adjusting an intensity of targeted infrared energy applied to the localized portion to sublimate the solid organic material;
   adjusting a duration of an infrared pulse applied to the localized portion to sublimate the solid organic material; and
   changing a targeting of infrared energy applied to the target to sublimate the solid organic material to avoid an area of a surface of the target from which the impurities originated.

10. The method of claim 1, further comprising:
    monitoring a sublimation rate of the solid organic material; and
    responsive to a change in the sublimation rate, performing at least one of:
    lowering said first temperature of the bulk;
    adjusting a cross-sectional area of targeted infrared energy applied to the localized portion to sublimate the solid organic material;
    adjusting an intensity of targeted infrared energy applied to the localized portion to sublimate the solid organic material;
    adjusting a duration of an infrared pulse applied to the localized portion to sublimate the solid organic material; and
    changing a targeting of infrared energy applied to the target to sublimate the solid organic material to avoid an area of a surface of the target from which the impurities originated.

11. The method of claim 1, further comprising:
    measuring temperature at a surface of the solid organic material by radiometry; and
    responsive to the measured temperature, performing at least one of:
    lowering said first temperature of the bulk;
    adjusting a cross-sectional area of targeted infrared energy applied to the localized portion to sublimate the solid organic material;

adjusting an intensity of targeted infrared energy applied to the localized portion to sublimate the solid organic material;

adjusting a duration of an infrared pulse applied to the localized portion to sublimate the solid organic material; and changing a targeting of infrared energy applied to the target to sublimate the solid organic material to avoid an area of the surface of the target from which the impurities originated.

* * * * *